United States Patent [19]
Arrigotti et al.

[11] Patent Number: 5,794,007
[45] Date of Patent: Aug. 11, 1998

[54] SYSTEM AND METHOD FOR PROGRAMMING PROGRAMMABLE ELECTRONIC COMPONENTS USING BOARD-LEVEL AUTOMATED TEST EQUIPMENT

[75] Inventors: George L. Arrigotti, Portland; James J. Grealish, Beaverton, both of Oreg.

[73] Assignee: Intel Corporation, Santa Clara, Calif.

[21] Appl. No.: 553,017

[22] Filed: Nov. 3, 1995

[51] Int. Cl.⁶ ..................................... G06F 13/00
[52] U.S. Cl. ........................... 395/500; 371/21.3
[58] Field of Search .................. 437/8; 395/500; 364/488–491; 371/261, 21.2, 21.3

[56] References Cited

U.S. PATENT DOCUMENTS

| | | | |
|---|---|---|---|
| 4,498,151 | 2/1985 | Henry | 364/900 |
| 4,926,117 | 5/1990 | Nevill | 324/158 |
| 5,276,839 | 1/1994 | Robb et al. | 395/425 |
| 5,323,017 | 6/1994 | D'Sooza | 324/158 |
| 5,479,618 | 12/1995 | Van de Steen et al. | 364/167.01 |
| 5,581,510 | 12/1996 | Furusho et al. | 365/201 |
| 5,650,734 | 7/1997 | Chu et al. | 326/38 |
| 5,661,677 | 8/1997 | Rondeau et al. | 365/63 |

*Primary Examiner*—Kevin J. Teska
*Assistant Examiner*—A. S. Roberts
*Attorney, Agent, or Firm*—Blakely, Sokoloff, Taylor & Zafman

[57] ABSTRACT

A system and technique utilized to efficiently load data into a programmable electronic component connected to a circuit board through the use of automated test equipment. The system includes an automated testing equipment and a programmable electronic component coupled to data and address lines utilized by the programmable electronic component. For the first circuit board of a batch of multiple circuit boards, the reference programmable electronic component receives and stores data from an external source, prior to the data being loaded from the reference programmable electronic component into the programmable electronic component. Thereafter, further programming of the reference programmable electronic component is not required. Rather, the programmable electronic component coupled to any subsequent circuit boards requires only the reference programmable electronic component to copy its contents upon receiving address and control signals from the external source to perform such an operation.

22 Claims, 8 Drawing Sheets

SYSTEM AND METHOD FOR PROGRAMMING PROGRAMMABLE ELECTRONIC COMPONENTS USING BOARD-LEVEL AUTOMATED TEST EQUIPMENT

BACKGROUND OF THE INVENTION

1. Field of the Invention

The present invention relates to the field of circuit board assembly. More particularly, the present invention relates to an apparatus and method for ensuring accurate programming of electronic components connected to a circuit board using board-level automated test equipment ("ATE").

2. Description of Art Related to the Invention

For many years, electronic systems (e.g., computers, printers, etc.) have been designed with one or more printed circuit boards which are electrically connected together to perform various functions. One of these printed circuit boards, which is commonly employed within computers, is referred to as a "motherboard". The motherboard typically is the main printed circuit board which provides interconnections between primary electronic components of the computer such as its processor(s), memory and the like.

Currently, businesses tend to follow a well-established circuit board assembly procedure in order to manufacture a fully functional circuit board. This circuit board assembly procedure has four sequential stages of which the second, third and fourth stages are performed in an assembly line environment while the first stage is performed beforehand, normally at an off-line site, in an effort to speed up the assembly line stages. The first stage involves programming various programmable electronic components using well-known manual or automated equipment operated by one or more persons. These programmable electronic components include, but are not limited to, read-only memory ("ROM"), erasable programmable read only memory ("EPROM") and electrically erasable and re-programmable non-volatile memory (typically referred to as "Flash" memory). Afterwards, electronic components are connected to the circuit board during the second or third stages.

The second and third stages involve assembly of the circuit board by connecting Surface Mount Technology ("SMT") components followed by Through Hole Mount Technology ("THMT") components through various widely-known techniques. For example, the technique for connecting SMT components to the circuit board may include the following steps: (i) solder paste application, (ii) proper placement of the. SMT components and (iii) reflow soldering to establish connections between bus lines previously routed in the circuit board and the SMT components. Likewise, the technique for connecting the THMT components may include the two steps: (i) proper placement of THMT components and (ii) wave soldering.

The final stage in manufacturing circuit boards involves testing each component (i.e., "in-circuit" testing) as well as the entire operation of the circuit board (i.e. "functional" testing) to determine whether the circuit board is functioning properly. More particularly, in-circuit testing is performed by an in-circuit tester (e.g., Hewlett-Packard 3070) such as that shown in perspective and in block diagram form in FIGS. 1a and 1b, respectively. Typically, the in-circuit tester 100 includes a control computer 110 and a testing mechanism 120. The control computer 110 executes control software which selects a test application dedicated to a particular type of circuit board design. The test application drives information to the testing mechanism 120. The testing mechanism 120 includes a test head 130 and a test fixture 140 for testing the functionality of a circuit board 150 mounted onto the test fixture 140. The test head 130 includes channel memories which propagate logic signals to a selected number of test pins 135 of the test head 130 based on information provided by the control computer 110.

The test fixture 140 includes contacts 141 aligned with at least some of the test pins 135 of which many of the contacts 141 are routed to corresponding spring probes 145. These spring probes 145 are positioned in such a manner so that when the circuit board 150 is placed on the test fixture 140, the spring probes 145 establish contact with various test pads (not shown) located at a bottom surface of the circuit board 150. These test pads are routed to various pins of the components attached to the circuit board 150. The test fixture 140 is customized for each type of circuit board design.

Since the testing stage requires a programmable electronic component containing Basic Input Output System ("BIOS") code to be programmed before testing can be completed, the programming stage is performed off-line before this testing stage. Consequently, the conventional circuit board assembly procedure affords a number of disadvantages. One disadvantage is that the conventional circuit board assembly procedure is quite costly because it imposes high conversion costs (i.e., the costs to convert the materials into a finished product) through increased labor, machine and floor space required for the offline site. Another disadvantage is that certain code changes are extremely difficult to implement if a programmable electronic device has already been connected to a circuit board because the programmable electronic device has to be removed from the circuit board, re-programmed and re-soldered to the circuit board.

Yet another realized disadvantage by the conventional circuit board assembly procedure is that it is quite difficult to estimate the number of programmable devices necessary to produce a specified number of operational circuit boards in order to keep component inventory to a minimum. A number of uncontrollable factors (e.g., yield losses due to originally defective or damaged programmable electronic devices) makes it difficult to coordinate these off-line programming operations with the operations of the assembly line. In addition, the conventional circuit board assembly procedure is exposed to the likelihood of incorrect programming of the electronic device due to human error.

It is contemplated that other procedures exist besides soldering preprogrammed electronic components (programmed off-line) onto circuit boards such as conventional On-Board Programming ("OBP"). The conventional OBP procedure involves the installation of "blank" (i.e., unprogrammed) memory components during board assembly. The in-circuit tester is used to program the memory components. However, like the conventional board assembly procedure, the conventional OBP procedure typically has a number of disadvantages.

One disadvantage is that the conventional OBP procedure requires additional time during assembly on the assembly line to complete the testing stage for each circuit board. This is quite disadvantageous because conversion costs are dependent on the cycle time, which is the number of seconds allotted for testing each circuit board in the production line. Thus, any procedure that increases the cycle time by more than a few seconds, drastically increases conversion costs. The conventional OBP procedure typically adds an additional twelve (12) seconds to the cycle time of a board containing a 256 kilobyte flash device verses approximately 3–5 seconds for the present invention. This makes the conventional OBP procedure infeasible in today's competitive marketplace.

A further disadvantage is that the test program controlling the conventional OBP procedure is difficult to update and maintain. In the event that the update is performed incorrectly, the programmable electronic component may be loaded with incorrect information.

Therefore, it would be advantageous to overcome the disadvantages associated with off-line programming of the programmable electronic component as well as the conventional OBP procedure.

BRIEF SUMMARY OF THE INVENTION

The present invention relates to a circuit, system and technique of programming a programmable electronic component ("Test component"), already-connected to a circuit board, through the use of automated test equipment. Basically, the circuit includes a second programmable electronic component. ("Reference component") coupled in parallel with the Test component through common address and data lines. The Reference component is controlled by the automated test equipment to copy its data contents into the Test component during on-line assembly in which these data contents are checked to verify accurate copying of the data contents.

BRIEF DESCRIPTION OF THE DRAWINGS

The features and advantages of the present invention will become apparent from the following detailed description of the present invention in which:

FIG. 1b is a block diagram of the conventional in-circuit tester of FIG. 1a.

DETAILED DESCRIPTION OF THE INVENTION

In the following description, an apparatus and method which enables an electronic component, already connected to a circuit board, to be accurately programmed by well-known Automated Test Equipment ("ATE") during assembly of the circuit board is shown. In the following detailed description, numerous specific details are set forth such as a specific configuration of a programming enhancement circuit which is used to directly program the electronic component. It should be borne in mind that the present invention need not be limited to this specific configuration used to program Basic Input Output System ("BIOS") code into Flash memory. Rather, the present invention applies to the programming of any code into any type of electronic component.

Figure 2:
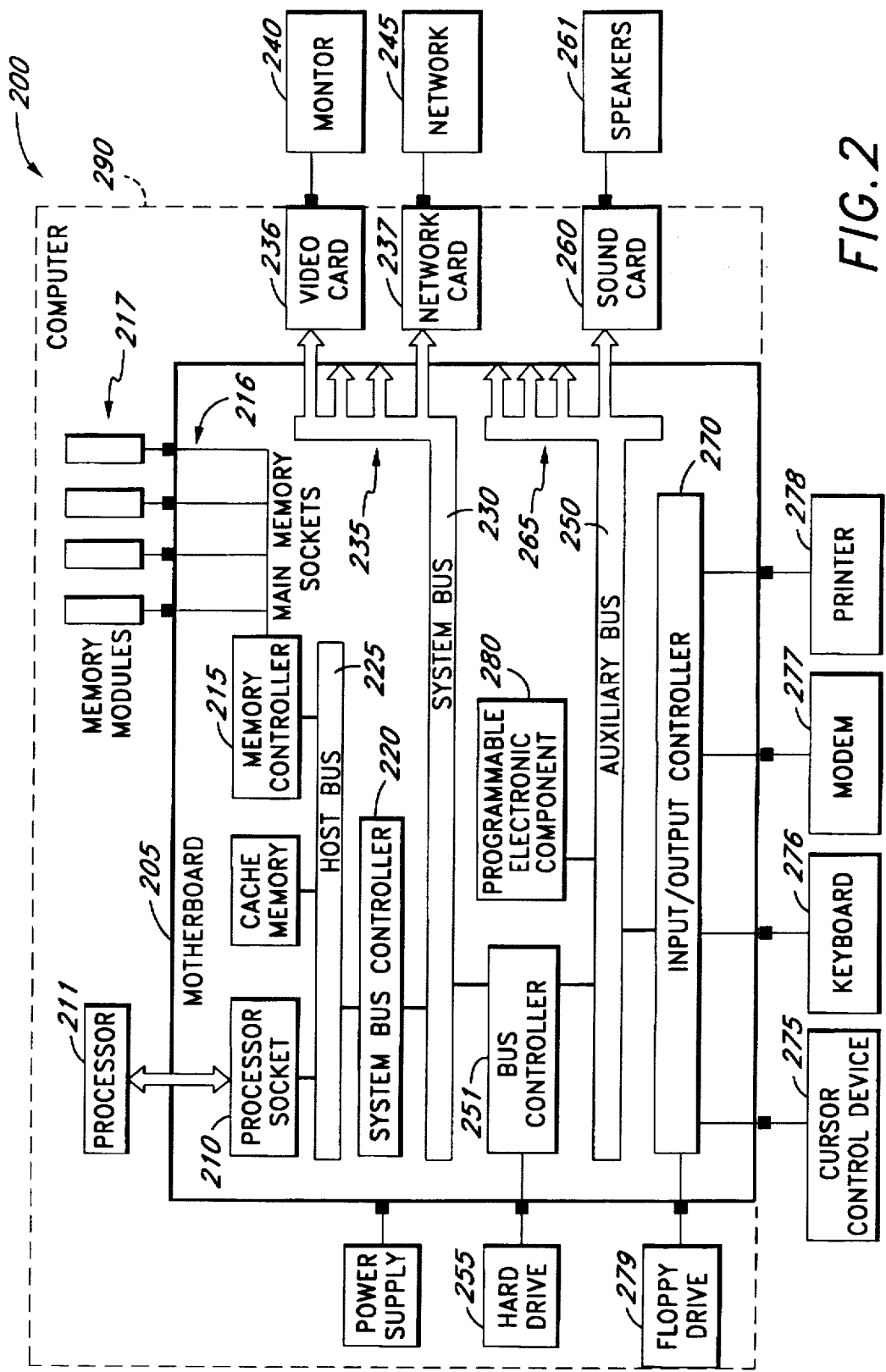
FIG. 2 is a simplified block diagram of an embodiment of a circuit board employed within a computer including a non-volatile storage element.

Referring to FIG. 2, a simplified embodiment of a circuit board, namely a motherboard 205 implemented within a chassis 290 of a computer 200, is shown. The motherboard 205 comprises a processor socket 210, a memory controller 215 and a system bus controller 220, all of which are coupled together through a host bus 225. The memory controller 215 is coupled to main memory sockets 216. As a result, a processor 211 and memory modules 217 are removably coupled to the processor socket 210 and the main memory sockets 216, respectively.

The system bus controller 220 is further coupled to a system bus 230 (e.g., a Peripheral Component Interconnect "PCI" bus) to enable information to be exchanged between components coupled to the host bus 225 and devices coupled to the system bus 230. The system bus 230 includes connectors 235 for coupling expansion cards, for example a video card 236 and a network card 237 employed within the chassis 290, which provide video and/or network capabilities to the computer when these cards are coupled to a monitor 240 and/or a network 245, respectively. The system bus 230, in turn, may be coupled to an auxiliary bus 250 (e.g., an Industry Standard Architecture "ISA" bus) via auxiliary controller 251 which provides a communication path with a hard disk drive 255 of the computer 200 and with additional expansion cards (e.g., sound card 260 for controlling external speakers 261) through connectors.

To allow input/output ("I/O") devices to be coupled to the motherboard 205, an I/O controller 270 is coupled to the auxiliary bus 250. The I/O controller 270 allows I/O devices such as a cursor control device 275, an alphanumeric keyboard 276, a modem 277, a printer 278 and a floppy disk drive 279 to transmit information into and receive information from the computer 200. This allows information to be input into the computer 200 from an external source as well as allows information to be output to an external source.

In order to boot-up the computer after a hardware or software based power-on reset, a programmable electronic component 280 containing BIOS code, preferably Flash memory, is shown to be coupled to the auxiliary bus 250 but may be coupled to the system bus 230 or host bus 225. Each time the computer 200 is powered-on, it reads its first instructions from the programmable electronic component 280 known to contain boot strap (or start-up) instructions. These boot-strap instructions, being the lowest level code supported by the computer 200, are executed even before the operating system (e.g., DOS™, Windows™, etc.) is loaded. While the operating system is running, the code stored in the programmable electronic component 280 is continually used to help the operating system access certain hardware resources of the computer 200.

It is contemplated that Flash memory is preferred over ROM or EPROM because its contents are more easily erased or upgraded without typically requiring component removal. For example, upgrading to a newer BIOS version could be accomplished through downloading the information into the Flash memory without use of ultraviolet light for EPROMs or complete substitution of another ROM component.

Figure 3A:
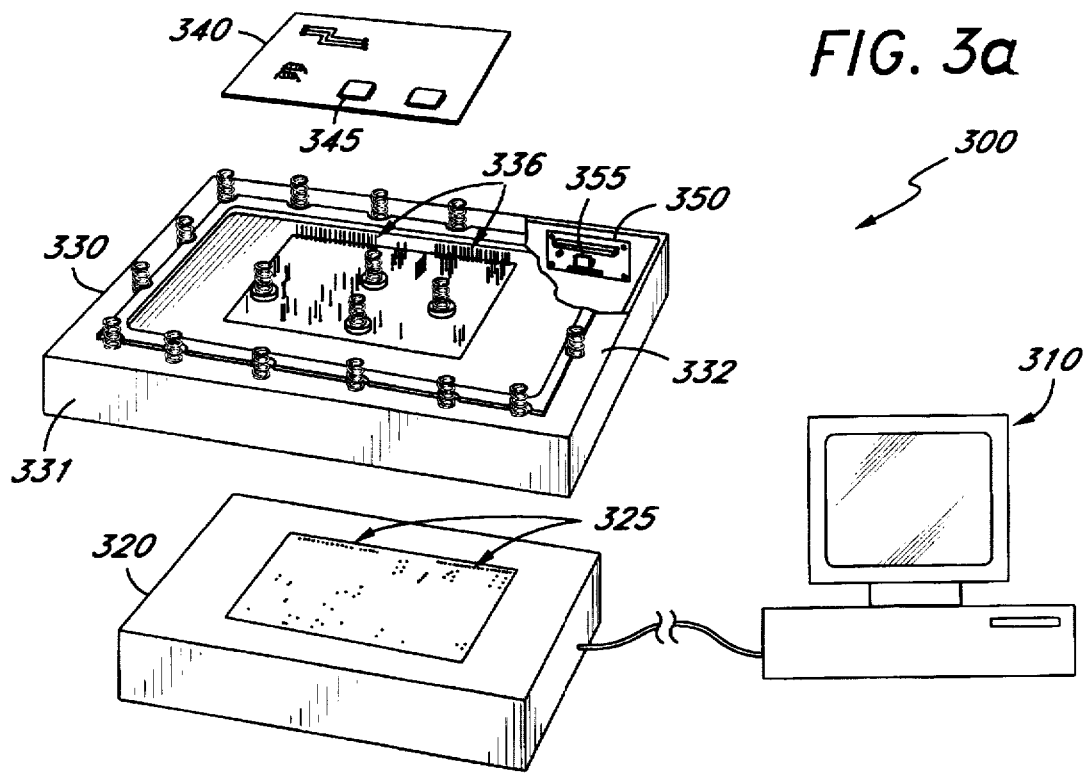
FIGS. 3a and 3b are an illustrative block diagram of one embodiment of the modified Automated Test Equipment including a programming enhancement circuit incorporated within the test fixture to program the non-volatile "Test" component.
Figure 3B:
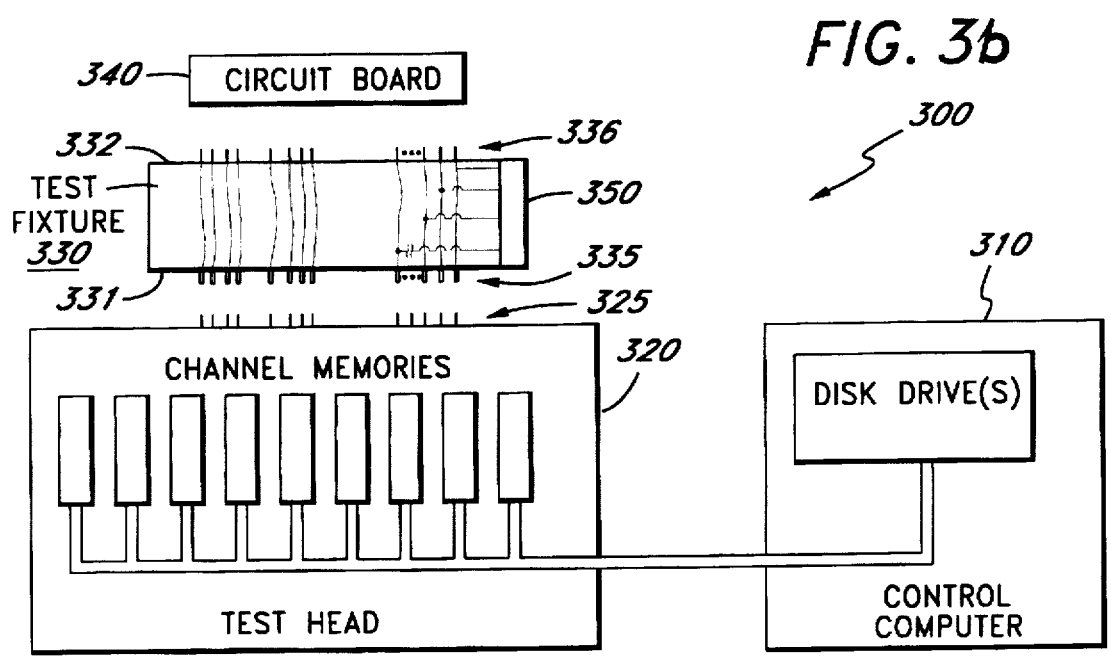

Referring now to FIGS. 3a and 3b, a perspective and block diagram view of one embodiment of a modified ATE configured to program a programmable electronic component (e.g., Flash memory) are shown. Preferably, the ATE is an in-circuit testing system slightly modified from the in-circuit tester of FIGS. 1a and 1b. The in-circuit testing system 300 includes a control computer 310, a test head 320, a test fixture 330 and the circuit board 340 having at least one programmable electronic component 345 coupled thereto (hereinafter referred to as the "Test component").

For the first circuit board of a specific design type, the control computer 310 initially drives information into the test head 320. The test head 320 receives the information and responds by driving a number of test pins of the test head 320 including those test pins 325 which provide data and address information to the test fixture 330. The test pins 325 are coupled to contacts 335, placed on a bottom surface 331 of the test fixture 330, to provide an electrical connection between the test head 320 and the test fixture 330. The contacts 335 route data and address information to a plurality of spring probes 336 protruding from a top surface 332 of the test fixture 330 and contacting test pads electrically coupled to the data and address pins of the Test component 345.

Figure 1A:
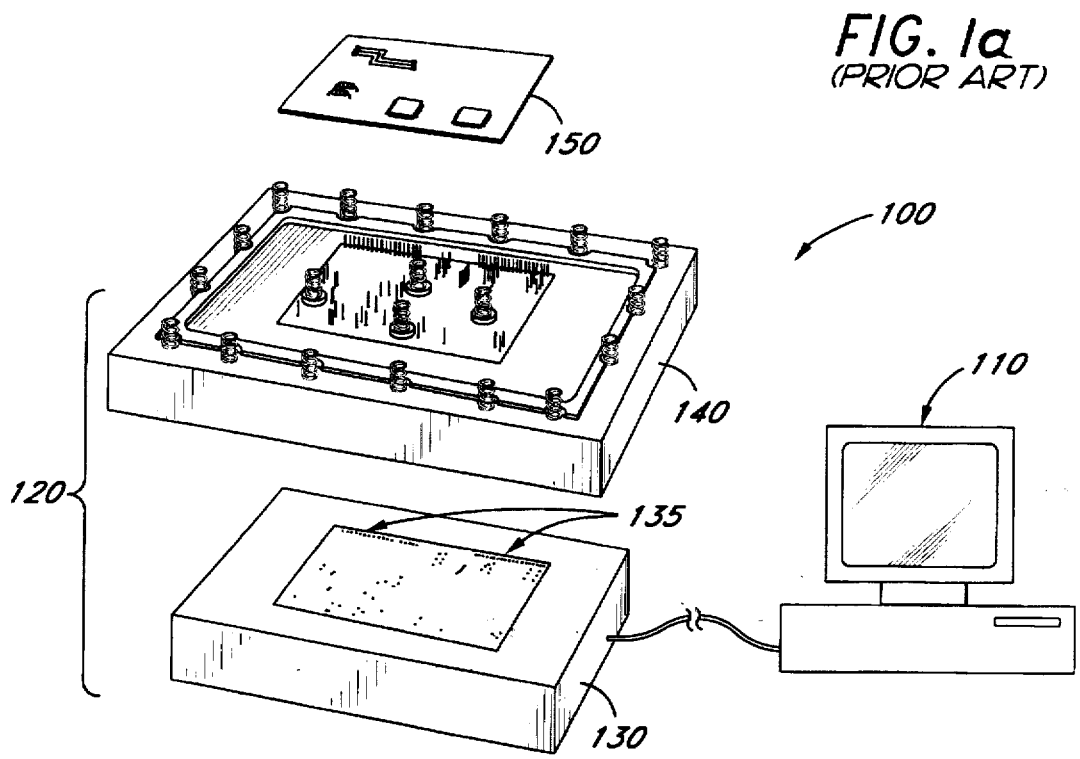
FIG. 1a is a perspective view of a conventional in-circuit tester including a test computer and a testing mechanism.
Figure 1B:
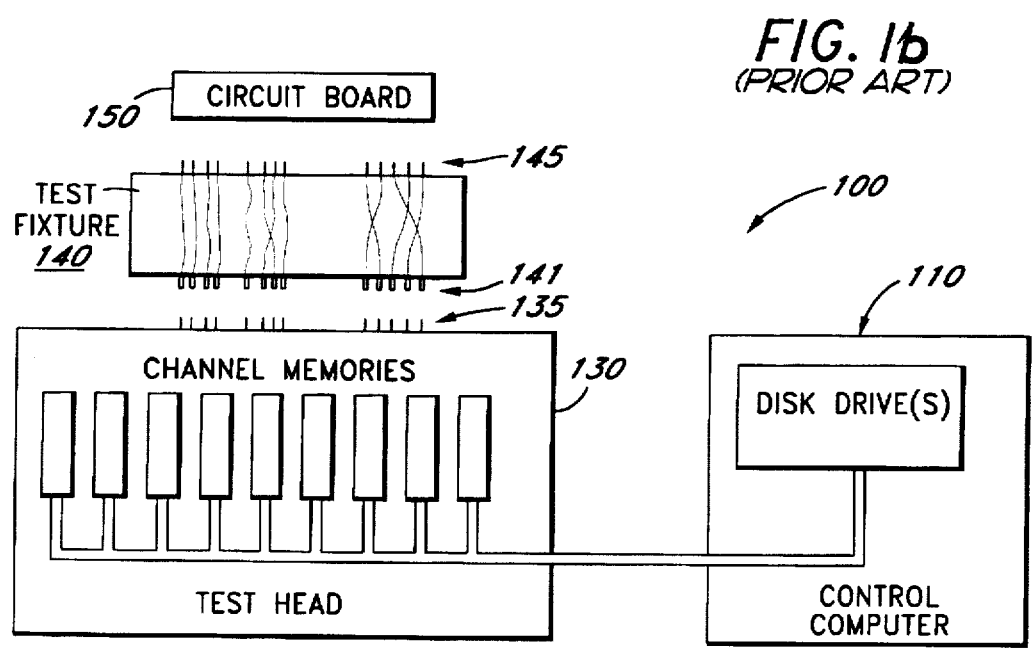

Unlike the test fixture of FIGS. 1a and 1b, the data and address information is initially routed to a programming enhancement circuit 350 implemented within the test fixture 330 via common address and data lines as generally shown. Typically, the programming enhancement circuit 350 would be removable so it can be easily replaced if damaged or non-functional. The programming enhancement circuit 350 includes a programmable electronic component 355 preferably, but not necessarily identical to the Test component 345 (hereinafter referred to as the "Reference component"). Both the Test component 345 and Reference component 355 include independent, dedicated control lines for data loading purposes.

The test head 320 drives data and address information onto common address and data lines while it manipulates certain control lines so that only the Reference component 355 is programmed. This is done for the same number of storage locations that are later programmed into the Test component 345. Next, the test head 320 drives only address and control information but places the Reference component 355 into a "Read" state and the Test component 345 into a "Write" (or "Programming") state. This causes the Reference component 355 to load its data into the Test component 345. For circuit boards subsequent to the first circuit board, only the second step is used, where the contents of the Reference component 355 are loaded (or copied) into the Test component 345.

Figure 4:
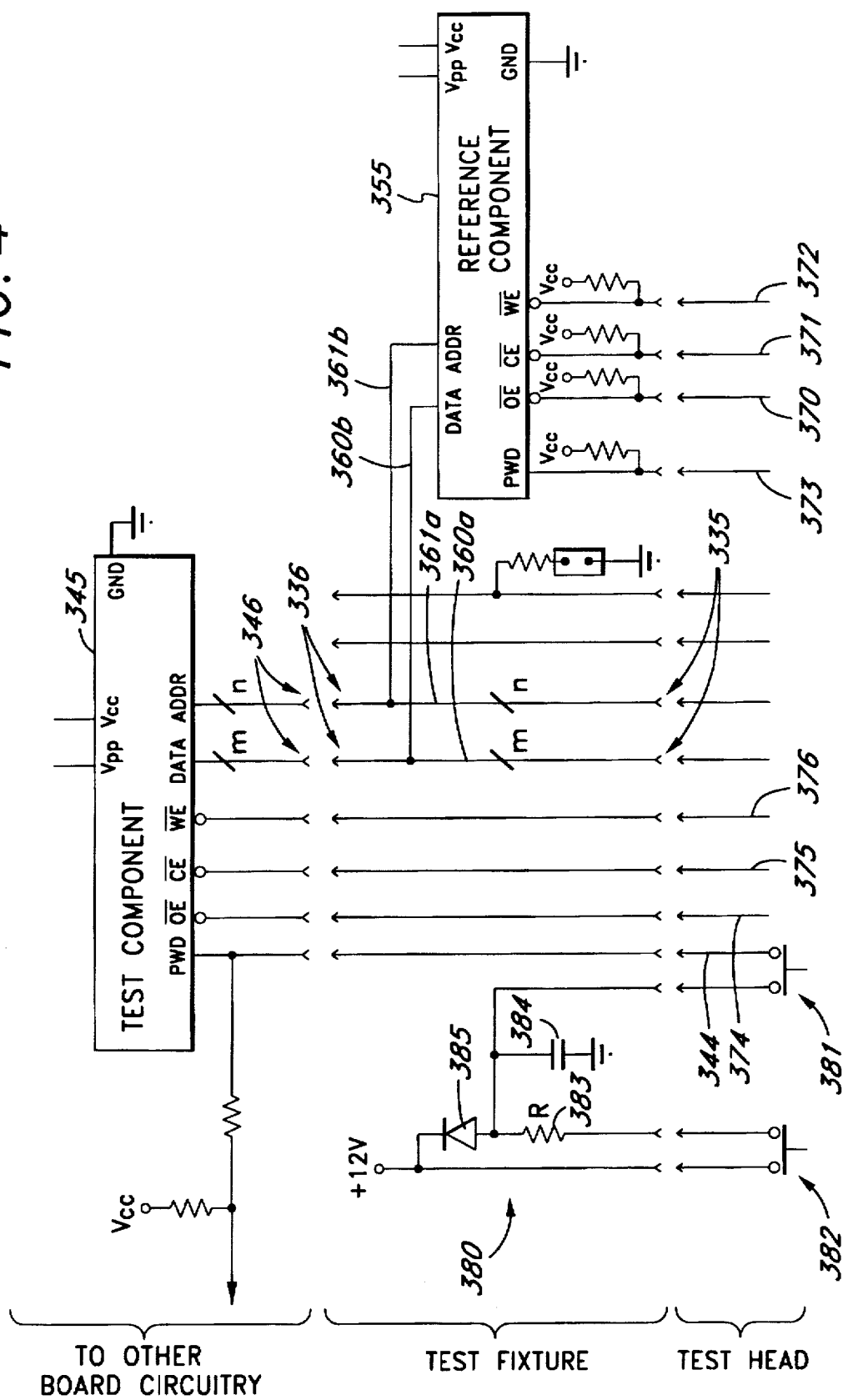
FIG. 4 is a schematic diagram of the programming enhancement circuit.

Referring to FIG. 4, a schematic diagram of the programming enhancement circuit 350 is shown. The programming enhancement circuit 350 includes the Reference component 355 and a boot-block release circuit 380. As previously mentioned, the data and address lines 360 and 361 through the test fixture 330 are wired so that the Reference component 355 and the Test component 345 receive data and address from the test head 320 in parallel. More specifically, the data and address received by the contacts 335 of the test fixture 330 are routed to the spring probes 336 of the test fixture 330 via data and address lines 360a and 361a and to the data and address pins of the Reference component 355 via data and address lines 360b and 361b. As shown, the spring probes 336 are coupled to test pads 346 corresponding to the data and address pins of the Test component 345.

Although their address and data lines are wired in parallel, the Reference component 355 and the Test component 345 are independently controlled by the test head 320 via dedicated Output Enable ("OE"), Chip Enable ("CE"), Write Enable ("WE") and Power-down ("PWD") lines 370–372 and 374–377, respectively. These control lines are used for programming the first circuit board of a batch by the following two-step process. First, the test head drives address and data information onto the common address and data lines, manipulating the control lines so that only the Reference component 355 is programmed. This is done for the same number of locations that will later be programmed into the Test component 345. Second, the test head drives only address and control information, cycling through all the addresses, putting the Reference component 355 into the "Read" state, and causing it to provide the data to program the Test component 345, which is placed in the "Write" state. This essentially copies the contents of the Reference component 355 into the Test component 345. As mentioned above, for circuit boards subsequent to the first circuit board, only the second step is used, where the contents of the Reference component 355 are copied into the Test component 345.

As previously mentioned, the Test component 345 normally is completely "blank" when it arrives to the modified ATE. Because some types of Flash memory include "boot-block instructions" that are protected from corruption by excluding access to the instructions unless various jumpers are manually placed, it is contemplated that the programming enhancement circuit 350 must be configured to allow the boot-block instructions previously written into the Reference component 355 to be copied into the Test component 345.

This is accomplished by connecting the boot-block release circuit 380 to the PWD input 377 of the Test component 345 which provides a sufficient voltage input into the PWD input 377 to indicate to the Test component 345 that the address space associated with the boot-block instructions can be written. The boot-block release circuit 380 includes a first relay 381 and a second relay 382. The first relay 381 provides a connection between the PWD input 377 and the boot-block release circuit 380. The second relay 382 places a voltage, approximately 12 volts in this embodiment, across the Resistor-Capacitor ("R-C") network of the boot block release circuit, consisting of resistor 383 (33 ohms in this case) and capacitor 384 (4.7 micro-farads in this case). This R-C network ensures that the voltage applied to PWD rises smoothly and without overshoot, which can be damaging to flash devices. Diode 385 also ensures that the voltage applied to the PWD input never exceeds approximately 12 volts. The first relay 381 is closed prior to the second relay 382, so that the voltage applied to PWD follows the controlled, non-overshooting rise imposed by the R-C network. After programming is complete, the relays are opened in the opposite order, so that the voltage applied to PWD can be decreased smoothly as the R-C network is discharged.

It is contemplated that it may be desirous for the present invention to program other information into the address space reserved for boot-block instructions or any protected address space which normally cannot be overwritten. For example, the information may include a unique serial number assigned to the circuit board having the Test component. This could be useful for a number of functions including software licensing in which software records the serial number on its floppy disk when loaded into a computer system. Further installation on other computer systems would be detected by the software causing it to refuse to load. Another example is to program a shipping date in the protected address space which can be used by PC manufacturers attempting to determine whether the PC is under warranty or not.

While the present invention enables programming of the Test component to generally occur at a faster average rate than conventional circuit board assembly or conventional OBP procedures thereby not affecting the "beat rate", there are a number of concerns that need to be addressed through software control of the programming enhancement circuit.

These concerns include determining whether the correct code is entirely written into the Test component and whether the Reference component contains the correct code or has become corrupted due to excessive use or any other event.

The board-specific test software that drives the in-circuit testing system to test a circuit board incorporates a number of software mechanisms to overcome the concerns of the present invention. One software mechanism is the use of a cyclic redundancy checkword ("CRC"), calculated by a commonly used test utility provided by ATE, to represent the contents of the Test component. When this CRC is guaranteed to be reliable, it is referred to as being "golden". In this case, the CRC of the Test component guaranteed to be reliable is referred to as a "golden Test CRC". At certain times, the current CRC of the Test component is determined and compared to the golden Test CRC. Another software mechanism is the calculation of a CRC to represent the desired contents of the Reference component (hereafter referred to as the "golden Reference CRC"). At various times, the CRC of the Reference component is determined and compared to the "golden" Reference CRC.

Other software mechanisms include a Data file, obtained from the compiler program or assembler program used to develop the BIOS code. The Data file contains the exact desired contents of the Test component, and is maintained in the control computer system. At certain times, this file is used to program the Reference component. At other times, it is used to verify the contents of the Test component. Moreover, a signature, containing certain information about the golden Test CRC, golden Reference CRC and the Data file, is maintained in a file ("signature file") in the control computer. The signature file is saved, only after verification that the golden Test CRC, golden Reference CRC and the Data file are reliable by (i) programming the Reference component from the Data file, (ii) programming the Test component from the Reference component and (iii) reading every byte in the Test component and checking it against the Data file. At certain times, a current signature is determined and compared to a previously stored signature file in order to determine if the golden Test CRC, golden Reference CRC or the Data file has been changed.

Figure 5:
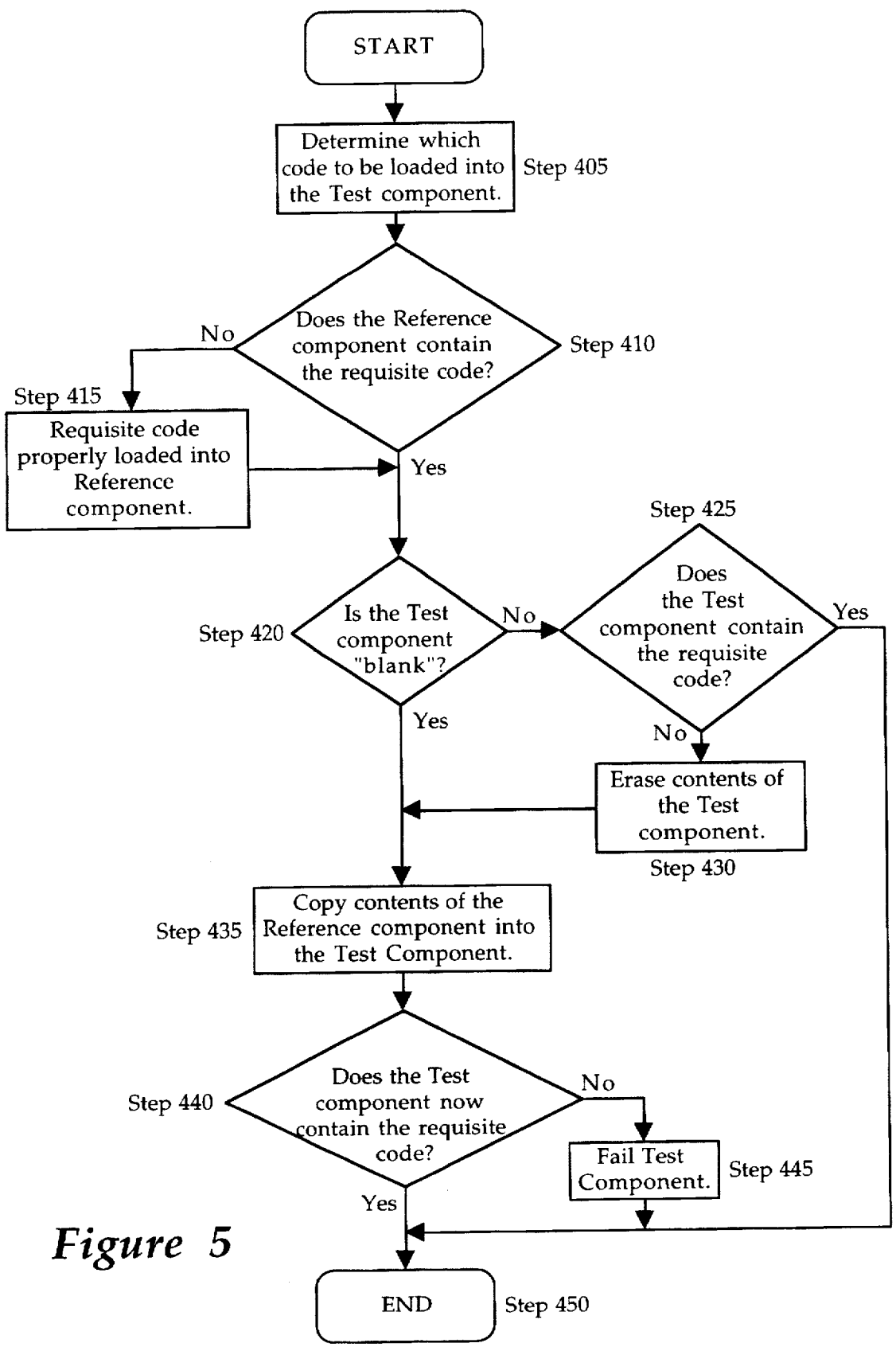
FIG. 5 is a flowchart illustrating the general operations of the board-specific test software controlling the programming of the Test component.

Referring now to FIG. 5, in which a simplified flowchart illustrating the general operations of the board-specific test software in cooperation with the programming enhancement circuit which control the programming of the Test component is shown. These operations are performed to program all Test components besides that of the first circuit board of the batch. First, based on the board type selected by the operator, a determination is made by the test software as to which code is to be programmed into the programmable electronic devices for this batch of circuit boards (Step 405). Next, the test software checks the contents of the Reference component to determine whether the Reference component contains the requisite code (Step 410). This is performed by calculating a CRC value for the current contents of the Reference component and comparing the CRC value to the golden Reference CRC previously calculated when the first board of this type was setup on the tester. This setup step is described later. If the CRC value does not match the "golden" Reference CRC, the Reference component is properly reloaded with the requisite code by the control computer (Step 415). This may require the Reference component to be erased before loading the requisite code.

Alternatively, if the CRC value matches the "golden" Reference CRC, the test software next determines whether the Test component is blank or programmed (Step 420). This operation is performed because Flash memory cannot be programmed by writing information into currently loaded storage locations. If the Test component is found to be programmed, the contents of the Test component are checked to see whether it contains the requisite code (Step 425). This is performed by calculating a CRC value for the current contents of the Test component and comparing the CRC value to the "golden" Test CRC previously calculated. If the CRC value does not match the "golden" Test CRC, the contents of the Test component are erased including the boot-strap instructions if applicable (Step 430). Alternatively, if the CRC value matches the "golden" Test CRC, then no further operations are needed (Step 450).

If the Test component is found to be blank or if the contents of the Test component have been erased, the contents of the Reference component are copied into the Test component (Step 435). In order to verify that the contents of the Test component are identical to the contents of the Reference component, the current CRC value for the Test component is calculated and compared to the "golden" Test CRC (Step 440). If there is a discrepancy, the circuit board fails the in-circuit test indicating that there is a defect related to the Test component (Step 445). Otherwise, the in-circuit test is completed without experiencing any errors.

Figure 6A:
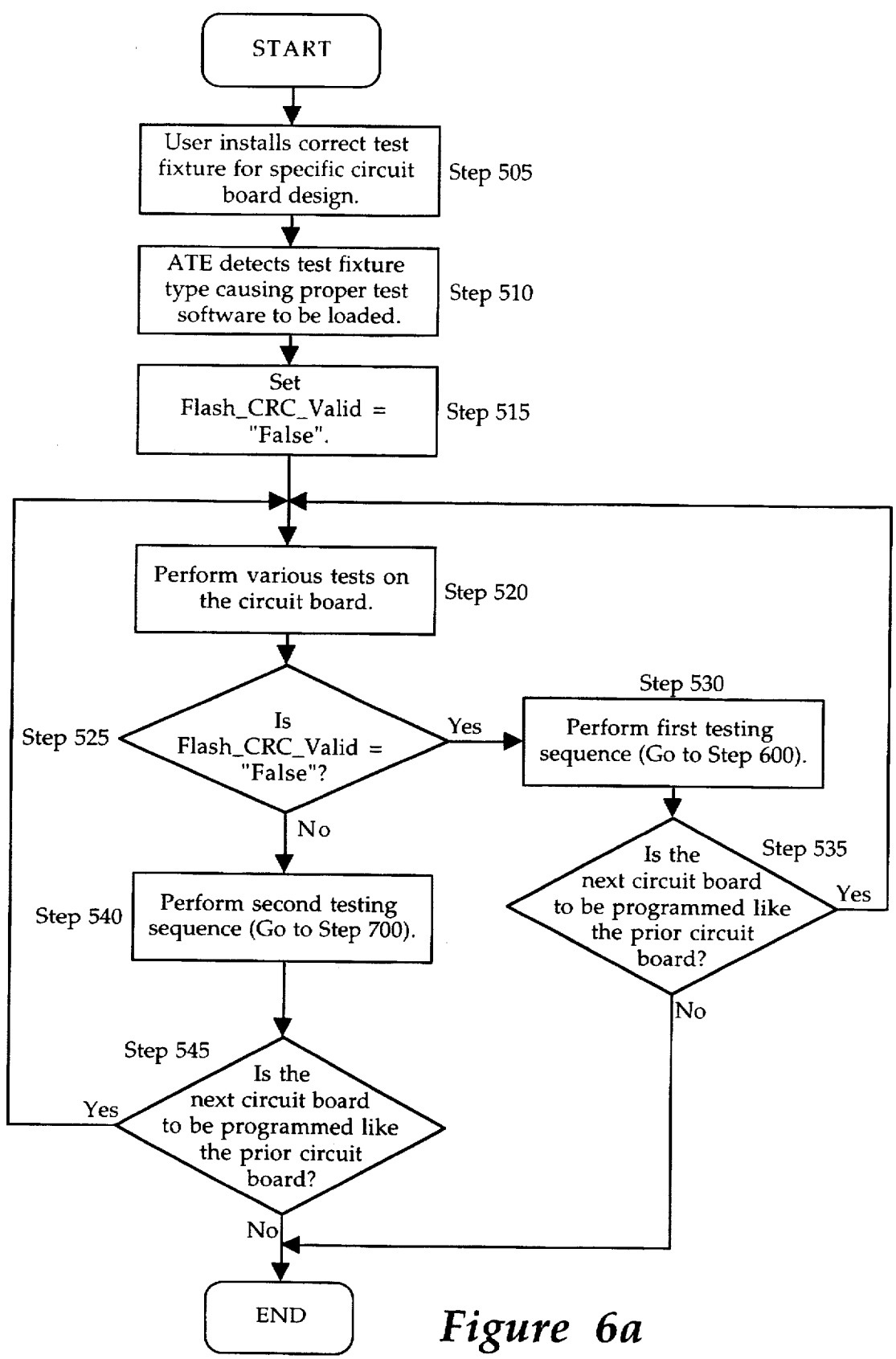
FIGS. 6a–6c are flowcharts illustrating the specific operations of e board-specific test software of FIG. 5.
Figure 6B:
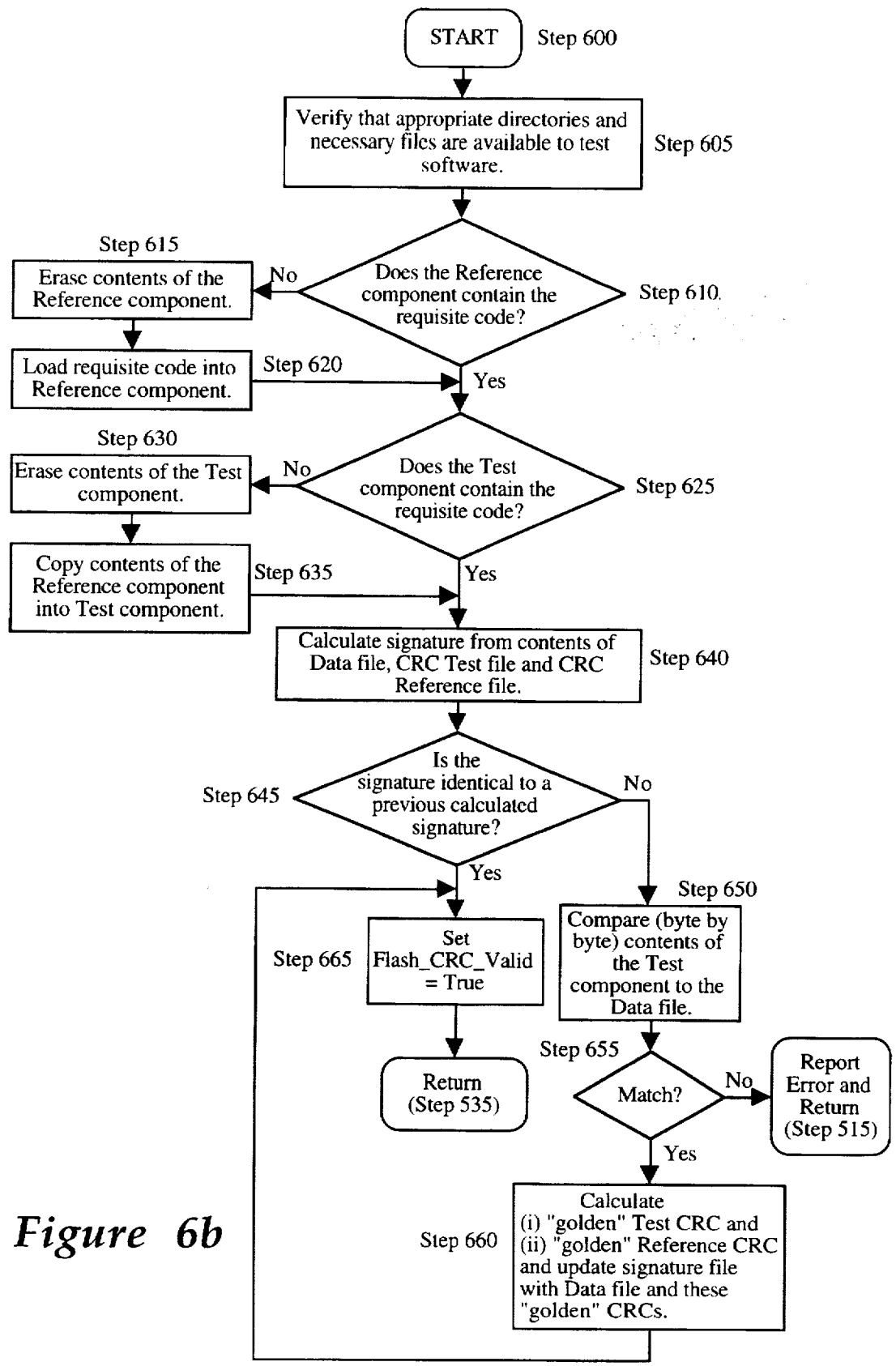
Figure 6C:
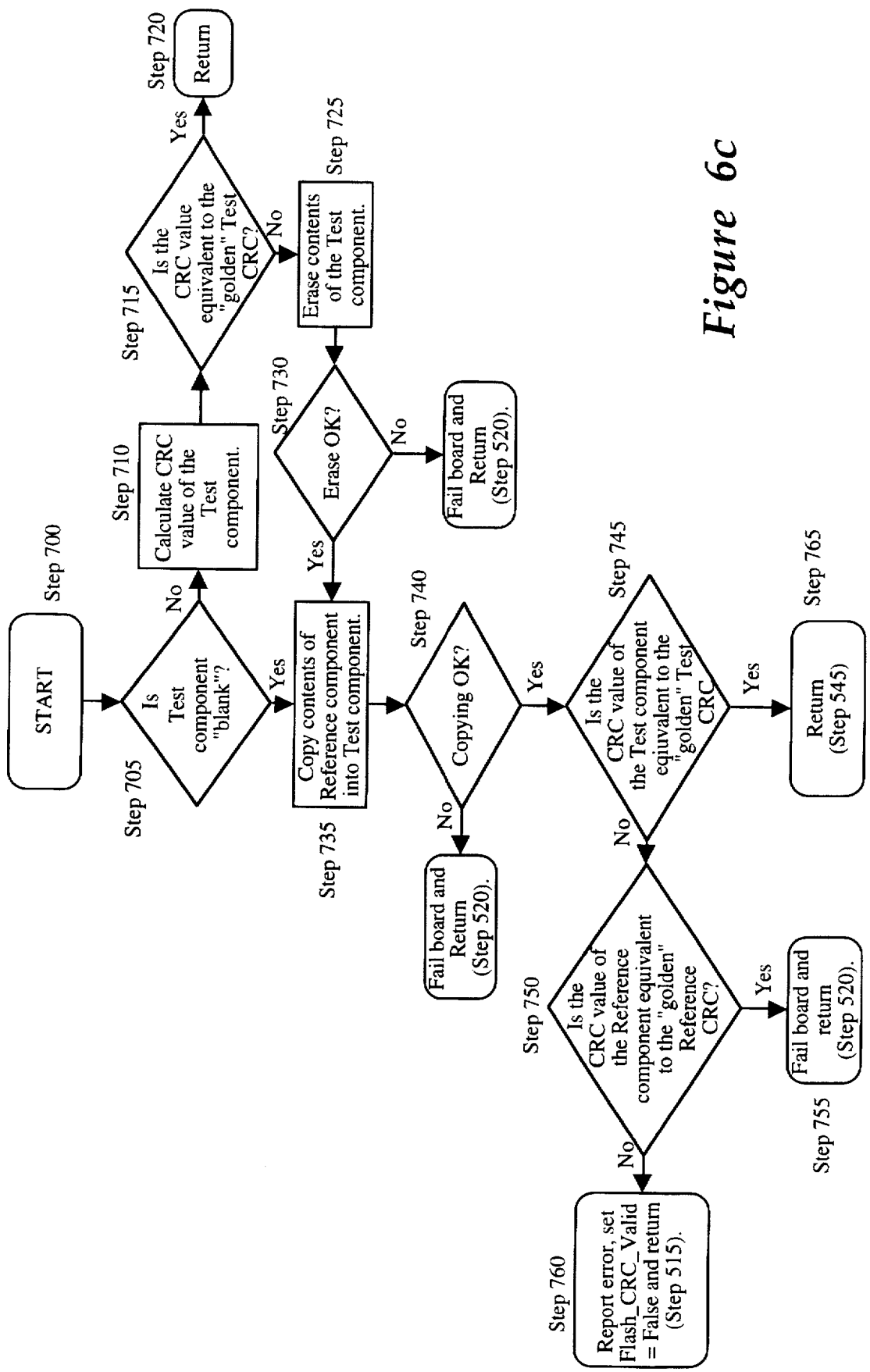

Referring to FIGS. 6a–6c, three flowcharts illustrating the specific operations of the board-specific test software in programming the Test component and, among other things, checking that the Test component is accurately programmed. These flowcharts represent two testing sequences; namely, (i) a first testing sequence being performed when the programming operations are initially performed for this type of circuit board at a point in time when the golden Test CRC, golden Reference CRC and the signature file are not yet known to be reliable (i.e., valid), or alternatively, when the programming operations are performed for the first circuit board of a batch after the golden Test CRC, golden Reference CRC and the signature file are reliable, and (ii) a second testing sequence performed after one of the first testing sequences has been completed when the golden Test CRC, golden Reference CRC and the signature file are guaranteed to be reliable (i.e., "golden") and the Reference component has been properly programmed.

Before programming of the Test component of a specific circuit board design can be performed, the user first installs the test fixture associated with the specific circuit board design (Step 505). In Step 510, the control computer detects the type of test fixture installed and loads the proper test software. Next, the test software sets at least one flag (e.g., Flash_CRC_Valid) to a "False" state (e.g., logic "0") to indicate that flash process controls currently used, namely in this embodiment the golden Test CRC, golden Reference CRC, signature file, Data file and the contents of the Reference component, are not guaranteed to be reliable. It is contemplated that more than one flag can be used, where each flag is associated with a different well of a multiple well fixture in order to reduce throughput time.

Thereafter, the modified ATE performs all normal test functions usually associated with this type of tester (Step 520). Next, in Step 525, the test software determines the state of the flash process controls (i.e., checks Flash_CRC_ Valid flag(s) to see if flash process controls are guaranteed to be reliable). In the event that the flash process controls are not guaranteed to be reliable, the test software undergoes the first testing sequence as shown in FIG. 6b (Step 530).

Referring now to FIG. 6b, the test software first determines that appropriate directories and necessary files are available to the test software (Step 605). One of these files includes the Data file as well as a CRC Test file and a CRC Reference file both of which may or may not contain reliable CRC information. Next, the test software checks the Reference component to determine whether it contains the requisite code (Step 610). This determination can be made by performing a cyclic redundancy check on the contents of the Reference component to obtain a CRC value and comparing the CRC value to the CRC stored in the CRC Reference file. If the CRC value is not equal to the CRC of the CRC Reference file, the Reference component is erased and loaded with the requisite code (Steps 615 and 620). It is contemplated that the contents of the Data file are loaded into the Reference component to provide the requisite code.

If the CRC value and the contents of the CRC Reference file match or if the Reference component has been erased and loaded without error, the test software checks the Test component to determine whether it contains the requisite code (Step 625) by similarly performing a cyclic redundancy check on the contents of the Test component to obtain a CRC value and comparing the CRC value to the CRC stored in the CRC Test file. If the CRC value is not equal to the CRC stored in the Test file, the Test component is erased and the Test component is loaded with the requisite code (Steps 630 and 635). One way for loading the requisite code is to copy the contents of the Reference component into the Test component.

In Steps 640 and 645, the signature of the Data file, CRC Test file and CRC Reference file is calculated and compared with a pre-existing signature stored in the control computer. If these signatures do not compare, a byte by byte comparison is made between the contents of the Test component and the Data file (Step 650). If the contents compare, indicating that the Test component has been programmed with the requisite code, the test software performs a cyclic redundancy check on the contents of the Test component and the Reference component and stores the results (i.e., the "golden" Test CRC and the "golden" Reference CRC) in the CRC Test file and CRC Reference file, respectively. In addition, the test software updates the signature using the "golden" Test CRC, the "golden" Reference CRC and the contents of the Data file (Step 655–660). However, if the signatures compared or after the operations of Steps 640–660 occur without error, the Flash_CRC_Valid flag is set to a "True" state (Step 665). The first testing sequence returns to determine whether the next circuit board is to be tested and programmed in a manner identical to the prior circuit board (Step 535 of FIG. 6a). If so, the operations for the next circuit board begin at Step 520. Otherwise, no further operations are needed and the testing and programming ends.

Referring back to FIG. 6a, if flash process controls are guaranteed to be reliable (i.e., the Flash_CRC_Valid flag(s) is(are) in a "True" state), the second testing sequence is performed as shown in FIG. 6c (Step 540). In FIG. 6c, the test software first determines if the Test component is "blank" i.e., it is not currently loaded with information (Step 705). If the Test component is not "blank", the test software calculates the CRC value of the Test component (Step 710). Thereafter, a comparison is made between the CRC value and the "golden" Test CRC stored in the CRC Test file (Step 715). If the CRC value is identical to the "golden" Test CRC, it is determined that the Test component is already programmed with the requisite code and it returns to Step 545 of FIG. 6a (Step 720). Otherwise, the contents of the Test component are erased and checked to see of the erase caused any errors to occur (Steps 725 and 730).

If the Test component is blank or no errors occurred during erasure of the contents of the Test component, the contents of the Reference component are copied into the Test component (Step 735). If no errors resulted from these operations (Step 740), the test software calculates the CRC value of the contents of the Test component and compares the CRC value to the "golden" Test CRC (Step 745). If the contents are identical, the test software in cooperation with the programming enhancement circuit has accurately programmed the Test component and no further operations are needed (Step 765). However, if the CRC value does not match the "golden" Test CRC, another calculation and comparison is performed with respect to the Reference component to determine if the error is a board failure thereby returning to Step 520 for the next circuit board tested or another type of error thereby setting Flash_CRC_Valid flag(s) to a "False" state (Steps 750–760).

Similar to the first testing sequence, the second testing sequence returns to determine whether the next circuit board is to be tested and programmed in a manner identical to the prior circuit board (Step 545 of FIG. 6a). If so, the operations for the next circuit board begin at Step 520. Otherwise, no further operations are needed and the testing and programming ends.

The present invention described herein may be designed in many different methods and using many different configurations. While the present invention has been described in terms of various embodiments, other embodiments may come to mind to those skilled in the art without departing from the spirit and scope of the present invention. The invention should, therefore, be measured in terms of the claims which follow.

What is claimed is:

1. A system comprising:
    a circuit board level automated test equipment; and
    a test fixture coupled to the circuit board level automated test equipment and adapted to communicate with a first programmable electronic component connected to a circuit board to be tested, the test fixture including
        a second programmable electronic component adapted to receive and store data from the circuit board level automated test equipment and to subsequently load the data into the first programmable electronic component, and
        a boot-block release circuit to provide a predetermined voltage directly to the first programmable electronic component to signal the first programmable electronic component to receive a boot-block instruction from the second programmable electronic component.

2. The system of claim 1, wherein the information includes one of a serial number, software licensing data and shipping data.

3. The system according to claim 1, wherein said test fixture further comprising a first plurality of address lines and a second plurality of data lines coupling the second programmable electronic component to the first programmable electronic component, the data is loaded from said second programmable electronic component into the first programmable electronic component by placing said second programmable electronic component in a Read state and said first programmable electronic component in a Write state.

4. The system according to claim 3, wherein said circuit board level automated testing equipment provides information including the data is written into and stored in said second programmable electronic component to enable loading of the data into the first programmable electronic component directly from said second programmable electronic component.

5. The system according to claim 1, wherein said bootblock release circuit is connected to power-down lines of the first programmable electronic component.

6. The system according to claim 1, wherein said first programmable electronic component is a flash memory component.

7. The system according to claim 6, wherein said second programmable electronic component is a flash memory component substantially similar to said first programmable electronic component.

8. The system according to claim 1, wherein said circuit board level automated testing equipment monitors whether said second programmable electronic component correctly loaded the data into said first programmable electronic component by using cyclic redundancy checkwords.

9. A system for loading data into a first programmable electronic component connected to a circuit board, the system comprising:

testing means for providing information, including the data, to a fixture means and for periodically monitoring whether the data was correctly loaded from the fixture means into the first programmable electronic component; and said fixture means for loading the data into the first programmable electronic component, said fixture means includes bus means for routing the information, including the data and its corresponding addresses, from the testing means into a programming means, said programming means for storing the data and loading the data into the first programmable electronic component upon receiving at least one control signal from said testing means via said bus means, and release means for directly enabling a plurality of bootblock instructions to be written into the first programming electronic component from the second programming electronic component.

10. The system according to claim 9, wherein said programming means of said fixture means includes a second programmable electronic component coupled to said bus means, wherein the data is loaded from said second programmable electronic component into the first programmable electronic component by placing said second programmable electronic component in a Read state and said first programmable electronic component in a Write state.

11. The system according to claim 10, wherein said first programmable electronic component is a flash memory component.

12. The system according to claim 11, wherein said second programmable electronic component is a flash memory component.

13. The system according to claim 9, wherein said testing means monitors whether said programming means correctly loaded the data into said first programmable electronic component by using cyclic redundancy checkwords.

14. A circuit for loading data into a first programmable electronic component connected to a circuit board, the circuit comprising:

a plurality of signal lines including (i) a first plurality of address lines coupled to the first programmable electronic component and (ii) a second plurality of data lines coupled to the first programmable electronic component; and a programmable electronic device coupled to said first plurality of address lines and said second plurality of data lines, the first programmable electronic component including a second programmable electronic component, and a release circuit coupled to at least one power signal line of the first programmable electronic component to enable information, including at least one bootblock instruction, to be loaded into the first programmable electronic component from the second programmable electronic component.

15. The system of claim 14, wherein the information includes one of a serial number, software licensing data and shipping data.

16. The circuit according to claim 14, wherein both said first and second programmable electronic components are flash memory.

17. A method comprising the steps of:

(a) determining whether an off-board reference programmable electronic component contains data to be subsequently loaded into an on-board programmable electronic component connected to a circuit board, wherein loading the data into the off-board reference programmable electronic component if the off-board reference programmable electronic component does not contain the data, and alternatively continuing to step (b) if the off-board reference programmable electronic component contains the data;

(b) copying the data from the off-board reference programmable electronic component into the on-board programmable electronic component; and (c) checking whether the on-board programmable electronic component has been correctly programmed by the off-board reference programmable electronic component to contain the data.

18. The method according to claim 17, wherein prior to step (a), the method further comprises the steps of installing a test fixture having the off-board reference programmable electronic component for a specific circuit board design; and determining the data to be loaded into the on-board programmable electronic component based on the test fixture installed.

19. The method according to claim 17, wherein prior to step (b) and after step (a), the method further comprises the step of determining whether the on-board programmable electronic component is blank, wherein if blank, continuing to step (b), and if not blank, determining whether the on-board programmable electronic component already contains the data, wherein erasing contents of the on-board programmable electronic component if the on-board programmable electronic component does not already contain the data, and alternatively disregarding steps (b) and (c) if the on-board programmable electronic component already contains the data.

20. A method for loading data into a programmable electronic component connected to a circuit board from a reference programmable electronic component, the method comprises the steps of:

(a) loading a test software to monitor whether the data is correctly loaded into the reference programmable electronic component;

(b) checking whether a first flag is set to a first state;

(c) performing a first testing sequence if said first flag is set to said first state, said first testing sequence is initially performed when the programmable electronic component being programmed with the data is a first circuit board of a batch of circuit boards being programmed;

(d) performing a second testing sequence if said first flag is not set to said first state, said second testing sequence is usually performed when the programmable electronic component is a circuit board of the batch of circuit boards following the first circuit board; and (e) repeating steps (b)–(d) for a subsequent programmable electronic component.

21. The method according to claim 20, wherein said first testing sequence includes the steps of:

(i) verifying that a plurality of files containing test information are available to said test software;

(ii) determining whether the programmable electronic component is blank, wherein if blank, continuing to step (iii), and if not blank, then erasing contents of the programmable electronic component, and copying the data contained in the reference programmable electronic component to the programmable electronic component; and (iii) comparing the data stored in the programmable electronic component with contents of a data file of said plurality of files, wherein if the data compares with said contents of said data file, then calculating a first cyclic redundancy checkword from the data stored in the programmable electronic component, calculating a second cyclic redundancy checkword from the data stored in the reference programmable electronic component, and calculating a signature with said data file and said first and second cyclic redundancy checkwords, and alternatively reporting an error if the data does not compare with said data file.

22. The method according to claim 20, wherein said second testing sequence includes the steps of:

(i) determining whether the programmable electronic component is blank, wherein if blank, continuing to step (ii), and if not blank, then calculating a cyclic redundancy checkword value for contents of the programmable electronic component, determining whether said cyclic redundancy checkword value is equivalent to a first cyclic redundancy checkword guaranteed to be reliable, wherein if so, returning to step (e), and if not, erasing contents of the programmable electronic component;

(ii) copying the data stored in the reference programmable electronic component to the programmable electronic component; and (iii) checking whether the programmable electronic component has been correctly programmed by the reference programmable electronic component by determining whether said cyclic redundancy checkword value is equivalent to said first cyclic redundancy checkword, and determining whether a cyclic redundancy checkword value for the contents of said reference programmable electronic component is equivalent to a second cyclic redundancy checkword guaranteed to be reliable.

* * * * *